US010009009B2

(12) United States Patent
Mimura et al.

(10) Patent No.: US 10,009,009 B2
(45) Date of Patent: *Jun. 26, 2018

(54) ELASTIC WAVE DEVICE INCLUDING ELECTRODE FINGERS WITH ELONGATED SECTIONS

(71) Applicant: Murata Manufacturing Co., Ltd., Nagaokakyo-shi, Kyoto-fu (JP)

(72) Inventors: Masakazu Mimura, Nagaokakyo (JP); Daisuke Tamazaki, Nagaokakyo (JP); Katsuya Daimon, Nagaokakyo (JP); Masato Araki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 78 days.

This patent is subject to a terminal disclaimer.

(21) Appl. No.: 14/944,448

(22) Filed: Nov. 18, 2015

(65) Prior Publication Data

US 2016/0072475 A1 Mar. 10, 2016

Related U.S. Application Data

(63) Continuation of application No. PCT/JP2014/063994, filed on May 27, 2014.

(30) Foreign Application Priority Data

May 29, 2013 (JP) .................. 2013-112839

(51) Int. Cl.
*H03H 9/145* (2006.01)
*H03H 9/25* (2006.01)
*H03H 9/02* (2006.01)

(52) U.S. Cl.
CPC .......... *H03H 9/25* (2013.01); *H03H 9/02535* (2013.01); *H03H 9/02992* (2013.01); *H03H 9/1457* (2013.01)

(58) Field of Classification Search
CPC ........... H03H 9/02535; H03H 9/02818; H03H 9/02858; H03H 9/02881; H03H 9/02992;
(Continued)

(56) References Cited

U.S. PATENT DOCUMENTS 4,999,535 A * 3/1991 Mariani ............. H03H 9/02818
310/312
6,121,860 A * 9/2000 Tsutsumi ............. H03H 9/0028
310/313 D (Continued)

FOREIGN PATENT DOCUMENTS

JP 53-116756 A 10/1978
JP 62-286305 * 12/1987
(Continued)

OTHER PUBLICATIONS

Official Communication issued in corresponding Korean Patent Application No. 10-2015-7033049, dated Aug. 22, 2016.
(Continued)

*Primary Examiner* — Barbara Summons
(74) *Attorney, Agent, or Firm* — Keating & Bennett, LLP

(57) ABSTRACT

In an elastic wave device, an interdigital transducer (IDT) electrode is disposed on a piezoelectric substrate. In at least one of first and second electrode fingers of the IDT electrode, elongated sections with a widthwise dimension larger than that of a center of the first and second electrode fingers in a longitudinal direction are provided in at least one of a portion closer to a base end of the first or second electrode finger and a portion closer to a leading end of the first or second electrode finger than a central region of the first or second electrode finger. At least one of first and second busbars includes a plurality of openings provided separately from each other along the longitudinal direction of the first and second busbars.

32 Claims, 8 Drawing Sheets

(58) Field of Classification Search
CPC ........ H03H 9/145; H03H 9/1457; H03H 9/25;
H03H 9/6496
USPC .............................. 333/193–196; 310/313 B
See application file for complete search history.

(56) References Cited

U.S. PATENT DOCUMENTS

| | | | | |
|---|---|---|---|---|
| 7,453,334 | B1* | 11/2008 | Abbott | H03H 9/02543 |
| | | | | 310/313 B |
| 9,712,139 | B2* | 7/2017 | Taniguchi | H03H 9/6483 |
| 2007/0018755 | A1 | 1/2007 | Mayer et al. | |
| 2008/0315972 | A1* | 12/2008 | Mayer | H03H 9/02881 |
| | | | | 333/193 |
| 2009/0295507 | A1 | 12/2009 | Kando et al. | |
| 2011/0068655 | A1 | 3/2011 | Solal et al. | |
| 2013/0051588 | A1 | 2/2013 | Ruile et al. | |
| 2016/0065176 | A1* | 3/2016 | Taniguchi | H03H 9/02992 |
| | | | | 333/195 |

FOREIGN PATENT DOCUMENTS

| | | | |
|---|---|---|---|
| JP | 04-356809 A | | 12/1992 |
| JP | 07-226643 A | | 8/1995 |
| JP | 10-145173 A | * | 5/1998 |
| JP | 2000-183681 A | * | 6/2000 |
| JP | 2001-267880 A | | 9/2001 |
| JP | 2003-188676 A | | 7/2003 |
| JP | 2007-507130 A | | 3/2007 |
| JP | 2011-101350 A | | 5/2011 |
| JP | 2013-518455 A | | 5/2013 |
| KR | 10-2009-0125104 A | | 12/2009 |
| KR | 10-2012-0120355 A | | 11/2012 |
| WO | 2011/088904 A1 | | 7/2011 |

OTHER PUBLICATIONS

Official Communication issued in International Patent Application No. PCT/JP2014/063994, dated Aug. 19, 2014.

* cited by examiner

ELASTIC WAVE DEVICE INCLUDING ELECTRODE FINGERS WITH ELONGATED SECTIONS

BACKGROUND OF THE INVENTION

1. Field of the Invention

The present invention relates to elastic wave devices, such as surface acoustic wave devices and boundary acoustic wave devices, and more particularly, to an elastic wave device in which an elongated section is provided in a portion of an electrode finger.

2. Description of the Related Art

Hitherto, elastic wave devices have been widely used as resonators or band pass filters. Japanese Unexamined Patent Application Publication No. 2011-101350 and International Publication No. WO2011/088904 each disclose a structure of a surface acoustic wave device in which transverse-mode spurious emissions are suppressed by the formation of a piston mode. For example, FIG. 9 of Japanese Unexamined Patent Application Publication No. 2011-101350 and FIG. 4 of International Publication No. WO2011/088904 show that elongated sections are provided in electrode fingers of an interdigital transducer (IDT) electrode. By providing these elongated sections, a low acoustic velocity region is formed.

FIG. 12 of Japanese Unexamined Patent Application Publication No. 2011-101350 and FIGS. 8(c) and 9 of International Publication No. WO2011/088904 show that a film covers part of an IDT electrode. More specifically, a film covers a region farther outward than a central region in the extending direction of the electrode fingers of the IDT electrode. Because of this structure, a low acoustic velocity region is formed.

However, in the structure in which elongated sections are provided in electrode fingers, there is a limitation on increasing the width of the elongated sections. That is, if the width of the elongated sections is excessively increased, the elongated sections may contact adjacent electrode fingers. Accordingly, the acoustic velocity of a low acoustic velocity region is not sufficiently decreased. It is thus difficult to reliably suppress transverse mode ripples. Further, additionally disposing a film on part of an IDT electrode increases the complexity of the manufacturing process steps and the cost.

SUMMARY OF THE INVENTION

Preferred embodiments of the present invention provide an elastic wave device in which it is possible to significantly reduce or prevent transverse mode ripples without increasing the complexity of the manufacturing process steps and the cost.

An elastic wave device according to a preferred embodiment of the present invention includes a piezoelectric substrate and an IDT electrode disposed on the piezoelectric substrate. In a preferred embodiment of the present invention, the IDT electrode includes a first busbar and a second busbar which is disposed separately from the first busbar, a plurality of first electrode fingers including a base end electrically connected to the first busbar and a leading end extending toward the second busbar, and a plurality of second electrode fingers including a base end connected to the second busbar and a leading end extending toward the first busbar.

In a preferred embodiment of the present invention, in at least one of the first and second electrode fingers, an elongated section is provided in at least one of a portion closer to the base end and a portion closer to the leading end than a central region of the first and second electrode fingers. The dimension of the elongated section in a widthwise direction is larger than that at a center of the first and second electrode fingers in a longitudinal direction. The widthwise direction is defined as a direction perpendicular to an extending direction of the first and second electrode fingers. At least one of the first and second busbars includes a plurality of openings provided separately from each other along a longitudinal direction of the first or second busbar. Each of the first and second busbars includes an inner busbar section which is positioned closer to the first or second electrode fingers than the openings and which extends in the longitudinal direction of the first and second busbars, a central busbar section in which the openings are provided, and an outer busbar section which is positioned opposite the inner busbar section with the central busbar section interposed therebetween.

In the elastic wave device according to a preferred embodiment of the present invention, the inner busbar section may preferably have a strip shape extending in a propagation direction of elastic waves.

In the elastic wave device according to a preferred embodiment of the present invention, the elongated section may preferably be provided in each of the first and second electrode fingers.

In the elastic wave device according to a preferred embodiment of the present invention, a plurality of the elongated sections may preferably be provided in at least one of the first and second electrode fingers.

In another specific aspect of the elastic wave device according to a preferred embodiment of the present invention, the IDT electrode may be a normal IDT electrode to which apodization weighting is not applied.

In the elastic wave device according to a preferred embodiment of the present invention, when the wave length of surface acoustic waves is indicated by $\lambda$, the distance between the leading ends of the first and second electrode fingers and the second and first busbars which respectively oppose the leading ends of the first and second electrode fingers may preferably be about $0.5\lambda$ or smaller, for example.

In still another specific aspect of a preferred embodiment of the present invention, the first electrode finger may include a plurality of the elongated sections which are provided separately from each other in the extending direction of the electrode fingers, the second electrode finger may include a plurality of the elongated sections which are provided separately from each other in the extending direction of the electrode fingers, and the plurality of elongated sections of the first electrode finger and the plurality of elongated sections of the second electrode finger may be alternately located in the extending direction of the electrode fingers in an area where the first electrode finger and the second electrode finger oppose each other.

In still another specific aspect of a preferred embodiment of the present invention, one elongated section provided in the first electrode finger may be positioned between adjacent elongated sections provided in the second electrode finger in the extending direction of the second electrode finger, and one elongated section provided in the second electrode finger may be positioned between adjacent elongated sections provided in the first electrode finger in the extending direction of the first electrode finger.

In still another specific aspect of a preferred embodiment of the present invention, the plurality of elongated sections of the first electrode finger and the plurality of elongated sections of the second electrode finger may be located so as to be fit into each other in an interdigitated pattern or configuration in an area where the first electrode finger and the second electrode finger are adjacent to each other in a propagation direction of elastic waves.

In an elastic wave device according to a preferred embodiment of the present invention, the acoustic velocity of a low acoustic velocity region is reduced by the provision of elongated sections and the inner busbar section, and a high acoustic velocity region is defined by the provision of a plurality of openings in the central busbar section. Accordingly, a piston mode is provided so as to effectively reduce or prevent transverse mode ripples. Moreover, the provision of an additional film is not essential, and thus, increases in complexity of the manufacturing process steps and the cost are avoided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described below in detail with reference to the drawings through illustration of specific preferred embodiments.

Figure 1A:
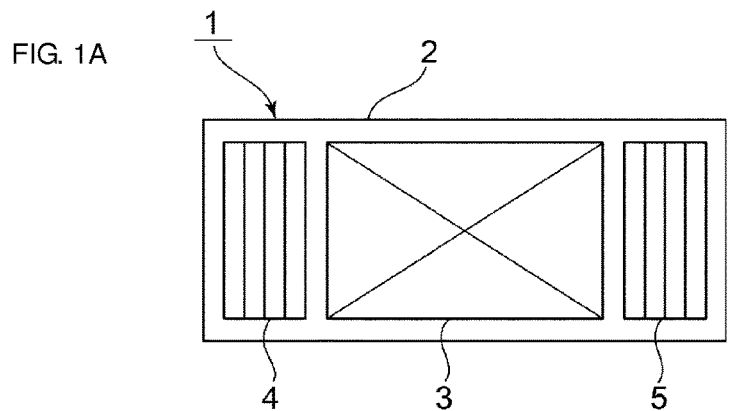
FIGS. 1A and 1B are respectively a schematic front sectional view of an elastic wave device according to a first preferred embodiment of the present invention and a partial cutaway enlarged plan view illustrating the major portion of the elastic wave device.
Figure 1B:
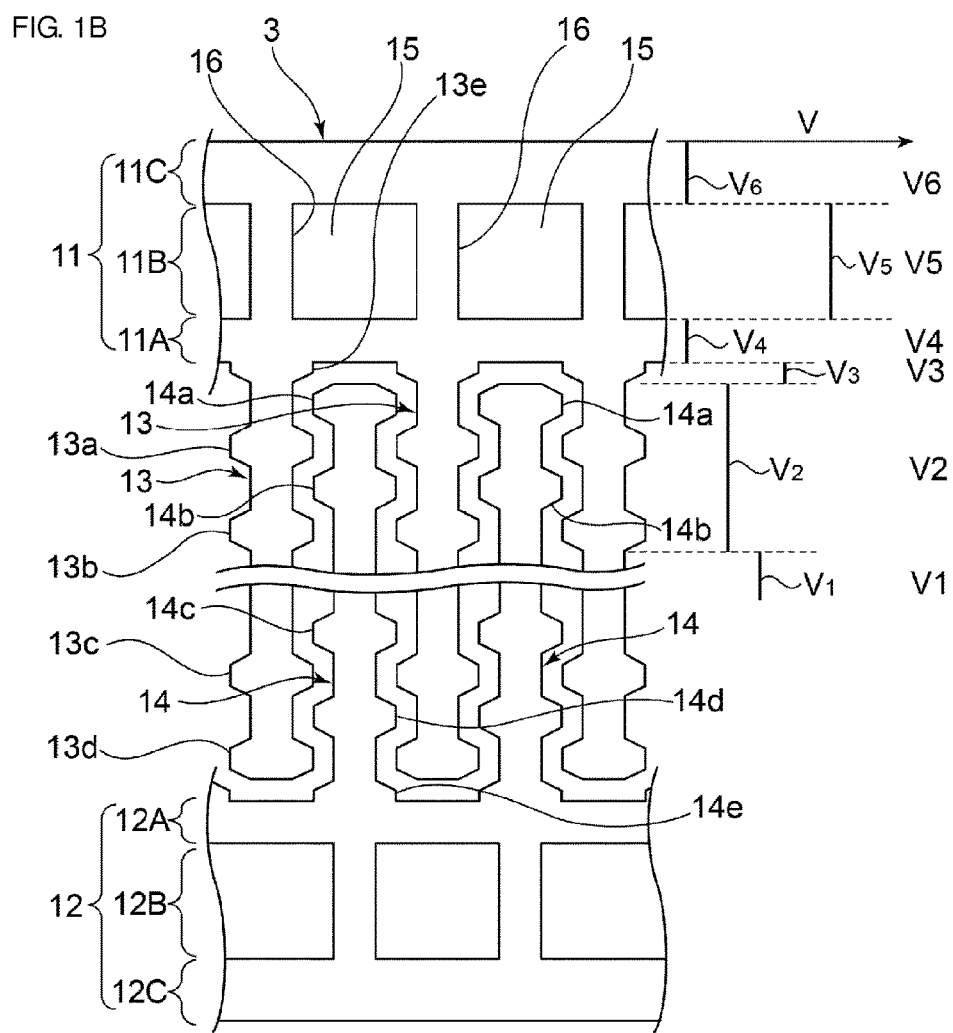

FIGS. 1A and 1B are respectively a schematic front sectional view of an elastic wave device according to a first preferred embodiment of the present invention and a partial cutaway enlarged plan view illustrating the major portion of the elastic wave device.

In the present preferred embodiment, an elastic wave device 1 preferably is a one-port surface acoustic wave resonator. As shown in FIG. 1A, the elastic wave device 1 includes a piezoelectric substrate 2. In this preferred embodiment, the piezoelectric substrate 2 preferably is a 128° Y—X $LiNbO_3$ substrate, for example. In the piezoelectric substrate 2, the slowness surface preferably has a convex shape. Accordingly, the piezoelectric substrate 2 may be formed of another piezoelectric monocrystal or piezoelectric ceramics as long as the electromechanical coupling coefficient of such a material is relatively large, such as in $LiNbO_3$ and $LiTaO_3$. An IDT electrode 3 is provided on the piezoelectric substrate 2. In the propagation direction of surface acoustic waves, a reflector 4 is located at one side of the IDT electrode 3, and a reflector 5 is located at the other side of the IDT electrode 3. Details of the IDT electrode 3 will be discussed later with reference to FIG. 1B.

In this preferred embodiment, the IDT electrode 3 and the reflectors 4 and 5 each includes laminated metal films including a Pt film and an Al film disposed on the Pt film. In this preferred embodiment, the thickness of the Pt film preferably is about 36 nm, and the thickness of the Al film preferably is about 150 nm, for example. However, the metal materials of the IDT electrode and the reflectors are not particularly restricted. Instead of laminated metal films, a single metal film may be used. There is also no particular restriction in the thicknesses of the electrodes.

In this preferred embodiment, although it is not shown in FIG. 1A, a $SiO_2$ film preferably having a thickness of about 570 μm is provided on the top surface of a region where the IDT electrode 3 and the reflectors 4 and 5 are disposed. On the surface of the $SiO_2$ film, projections and depressions that match the electrode shapes of the IDT electrode and the reflectors are provided.

The IDT electrode 3 preferably is a normal IDT electrode to which apodization weighting is not applied, and the period of the electrode fingers preferably is about 1.921 μm, for example. However, the period of the electrode fingers of the IDT electrode 3 is not particularly restricted. For example, preferably the number of pairs of electrode fingers is 133, and the intersecting portion is about 15λ (λ is the wave length of elastic waves excited in the IDT electrode). The reflectors 4 and 5 are grating reflectors at which ends are short-circuited. The number of electrode fingers of each of the reflectors 4 and 5 is 20, for example.

The characteristic of the elastic wave device 1 of this preferred embodiment is as follows. The structure of the IDT electrode 3 is such that the occurrence of transverse mode ripples is significantly reduced or prevented by providing a piston mode. This will be discussed below with reference to FIG. 1B.

The IDT electrode 3 includes a first busbar 11 and a second busbar 12, which is separated from the first busbar 11. The first busbar 11 and the second busbar 12 extend in parallel or substantially in parallel with the propagation direction of surface acoustic waves.

The base ends of a plurality of first electrode fingers 13 are connected to the first busbar 11. The leading ends of the plurality of first electrode fingers 13 extend in a direction from the first busbar 11 toward the second busbar 12. That is, the plurality of first electrode fingers 13 extend in a direction perpendicular to the propagation direction of surface acoustic waves.

The base ends of a plurality of second electrode fingers 14 are connected to the second busbar 12. The leading ends of the plurality of second electrode fingers 14 extend in a direction from the second busbar 12 toward the first busbar 11. That is, the plurality of second electrode fingers 14 also extend in a direction perpendicular or substantially perpendicular to the propagation direction of surface acoustic waves.

The plurality of first electrode fingers 13 and the plurality of second electrode fingers 14 are fit into each other in an interdigitated pattern or configuration. Elongated sections 13a, 13b, 13c, and 13d are provided in the first electrode finger 13. Elongated sections 14a, 14b, 14c, and 14d are provided in the second electrode finger 14. The shape of the elongated section 13a will be discussed below as a representative on behalf of the elongated sections 13a through 13d and 14a through 14d. The elongated section 13a is provided such that the widthwise dimension, that is, the dimension along the propagation direction of surface acoustic waves, is wider than that of the remaining section of the first electrode finger 13. In this preferred embodiment, the elongated section 13a preferably is an isosceles trapezoid projecting from the side edges of the electrode finger 13 toward the propagation direction of surface acoustic waves, for example. However, the elongated section is not restricted to the above-described shape, and it may be a projecting portion of another shape, such as a semicircular projecting portion, projecting from the side edges of the electrode finger 13 toward the propagation direction of surface acoustic waves.

The elongated sections 13a and 13b are disposed closer to the base end of the first electrode finger 13. In other words, the elongated sections 13a and 13b are closer to the first busbar 11. On the other hand, the elongated sections 13c and 13d are disposed closer to the leading end of the first electrode finger 13, that is, the second busbar 12.

Concerning the second electrode finger 14, the elongated sections 14a and 14b are disposed closer to the leading end of the second electrode finger 14. The elongated sections 14a, 14b, 13a, and 13b are alternately disposed in a region closer to the first busbar 11 in a direction perpendicular or substantially perpendicular to the propagation direction of surface acoustic waves, that is, in the extending direction of the electrode fingers. Accordingly, the elongated section 13a is disposed such that it is interposed between the elongated sections 14a and 14b, and the elongated section 14b is disposed such that it is interposed between the elongated sections 13a and 13b. In FIG. 1B, the end portion of the elongated section 13a closer to the electrode finger 14 is aligned with the end portions of the elongated sections 14a and 14b closer to the electrode finger 13 in the direction of the electrode fingers. This end portion of the elongated section 13a may be positioned even closer to the electrode finger 14 beyond the end portions of the elongated sections 14a and 14b closer to the electrode finger 13. Similarly, the end portion of the elongated section 14a closer to the electrode finger 13 is aligned with the end portions of the elongated sections 13a and 13b closer to the electrode finger 14 in the direction of the electrode fingers. This end portion of the elongated section 14a may be positioned even closer to the electrode finger 13 beyond the end portions of the elongated sections 13a and 13b closer to the electrode finger 14.

In various preferred embodiments of the present invention, it is preferable that the plurality of elongated sections 13a and 13b located in the direction of the first electrode finger 13 and the plurality of elongated sections 14a and 14b located in the direction of the second electrode finger be alternately disposed in the direction of the electrode fingers. That is, it is desirable that the first electrode finger 13 and the second electrode finger 14 each include a plurality of elongated sections and that the elongated sections be disposed such that one elongated section of the first electrode finger 13 is interposed between adjacent elongated sections of the second electrode finger in the direction of the second electrode finger and such that one elongated section 14b of the second electrode finger 14 is interposed between the adjacent elongated sections 13a and 13b of the first electrode finger 13 in the direction of the first electrode finger 13. With this configuration, it is possible to reduce the loss in a frequency range between the resonant frequency and the anti-resonant frequency, compared with a structure in which an electrode finger includes a single elongated section. The reason for this may be as follows. Due to the presence of a plurality of regions of different acoustic velocities within a low acoustic velocity section, elastic waves excited in the central region in the direction of the intersecting width of the IDT electrode are reflected by the boundaries of the regions of the different acoustic velocities, and are less likely to leak to the outside of the interesting width. Because of this reason, in the region where the first electrode finger 13 and the second electrode finger 14 oppose each other in the propagation direction of elastic waves, it is desirable that the plurality of elongated sections 13a and 13b and the plurality of elongated sections 14a and 14b be located such that they are fit into each other in an interdigitated pattern or configuration.

Similarly, in the region closer to the second busbar 12, the elongated sections 14c, 13c, 14d, and 13d are alternately located in the extending direction of the electrode fingers.

In the area where the elongated sections 13a and 13b and the elongated sections 14a and 14b are provided, a region V2 shown in FIG. 1 is provided. V1 through V6 on the right side of FIG. 1B indicate regions located farther outward than the center of the IDT electrode 3 in a direction perpendicular or substantially perpendicular to the propagation direction of surface acoustic waves. Velocities $V_1$ through $V_6$ of elastic waves propagating through the regions V1 through V6, respectively, (hereinafter such velocities will be referred to as "acoustic velocities") are schematically shown in FIG. 1B. In this specification, the acoustic velocity of the region Vn (n is a natural number) will be hereinafter indicated by $V_n$. In this case, the region V1 is the central region of the IDT electrode positioned between the elongated sections 13b and 13c.

The acoustic velocity of the region V2 where the elongated sections 13a, 13b, 14a, and 14b are provided is lower than that of the region V1 at the center of the IDT electrode.

In this preferred embodiment, at the base end of the electrode finger 13, a projecting portion 13e which projects in the direction of the electrode finger width is provided. Accordingly, in the region V3 where the projecting portion 13e is provided, the acoustic velocity is lower than the high acoustic velocity region V5, which will be discussed later. However, since there is no presence of second electrode fingers 14 in the region V3, the acoustic velocity $V_3$ is higher than the acoustic velocity $V_2$ of the region V2.

Japanese Unexamined Patent Application Publication No. 2011-101350 and International Publication No. WO2011/088904 also disclose the above-described configuration in which the region V2 at a lower acoustic velocity is defined by providing the elongated sections 13a, 13b, 14a, and 14b. On the side of the second busbar 12, similarly, the region where the elongated sections 13c, 13d, 14c, and 14d are provided defines a region V2.

In this preferred embodiment, the first busbar 11 includes an inner busbar section 11A, a central busbar section 11B, and an outer busbar section 11C. In this case, the terms "inner" and "outer" are defined as follows on the basis of the extending direction of the electrode fingers of the IDT electrode 3. "Inner" refers to the inner side where the first and second electrode fingers 13 and 14 are located, and "outer" refers to the outer side opposite the inner side.

The inner busbar section 11A is a portion to which the base ends of the above-described plurality of first electrode fingers 13 are connected. In this preferred embodiment, the inner busbar section 11A preferably has a narrow strip shape extending in the propagation direction of surface acoustic waves. Since the inner busbar section 11A is a metallized portion, it defines the region V4 at a low acoustic velocity.

In the central busbar section 11B, a plurality of openings 15 are provided separately from each other along the propagation direction of surface acoustic waves. In this preferred embodiment, the openings 15 are positioned between interconnecting portions 16, 16 extending in the extending direction of the electrode fingers. In this preferred embodiment, the interconnecting portions 16 preferably have the same or substantially the same width as that of the first electrode fingers 13 and are located on lines extending from the first electrode fingers 13. However, the dimensions and the position of the interconnecting portions 16 are not restricted to those as described above. Additionally, in this preferred embodiment, the openings 15 have a square or substantially square shape, but they are not restricted to this shape.

In the central busbar section 11B, the interconnecting portions 16 and the openings 15 are alternately disposed along the propagation direction of surface acoustic waves. Accordingly, a non-metallized portion occupies a large proportion of the central busbar section 11B. Thus, the central busbar section 11B defines the region V5 at a high acoustic velocity. Openings are not formed in the outer busbar section 11C. Accordingly, the outer busbar section 11C is a metallized portion, and thus, it defines the region V6 at a low acoustic velocity.

Similarly, in the second busbar 12, an inner busbar section 12A, a central busbar section 12B, and an outer busbar section 12C are provided. The same sections of the second busbar as those of the first busbar 11 are designated by like reference numerals, and an explanation thereof will thus be omitted.

In the elastic wave device 1, the IDT electrode 3 is provided as described above. Accordingly, low acoustic velocity regions are located farther outward than the central region V1, and the region V5 at a high acoustic velocity is located farther outward than the low acoustic velocity regions V2 through V4. With this configuration, it is possible to provide a piston mode so that transverse mode ripples are effectively reduced or prevented. Additionally, elastic waves are effectively trapped. This will be discussed below in detail with reference to FIGS. 2 through 6.

Figure 2:
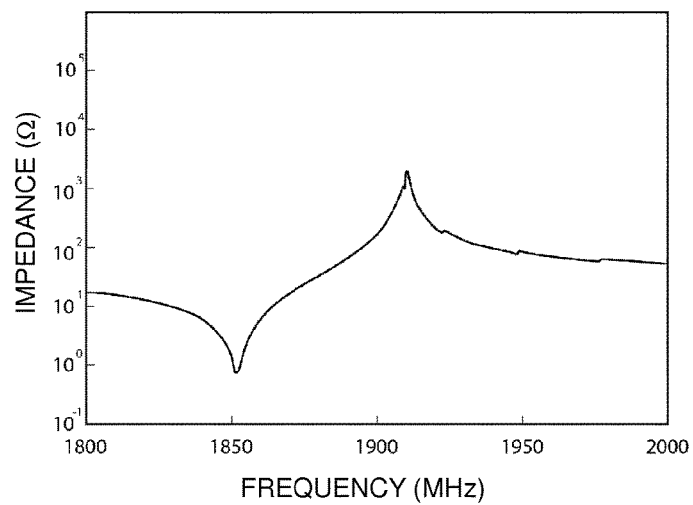
FIG. 2 is a graph illustrating an impedance-frequency characteristic of an elastic wave device of a preferred embodiment of the present invention.
Figure 3:
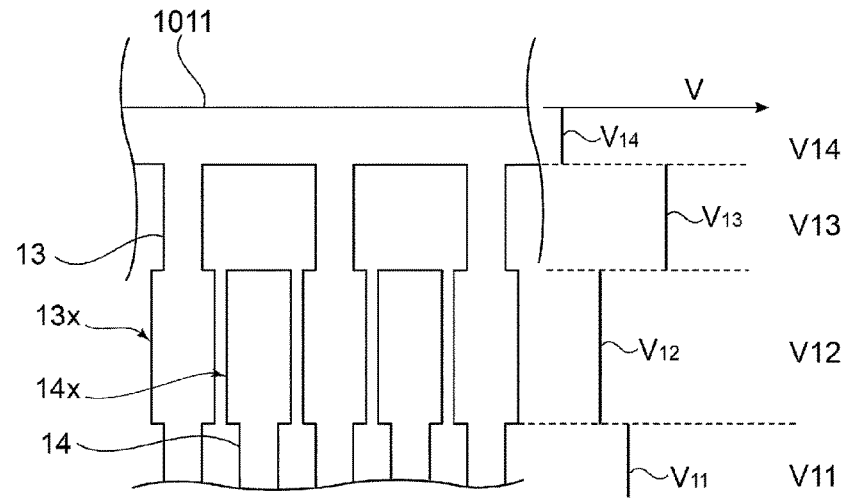
FIG. 3 is a partial cutaway plan view illustrating the major portion of an elastic wave device prepared for comparison.
Figure 4:
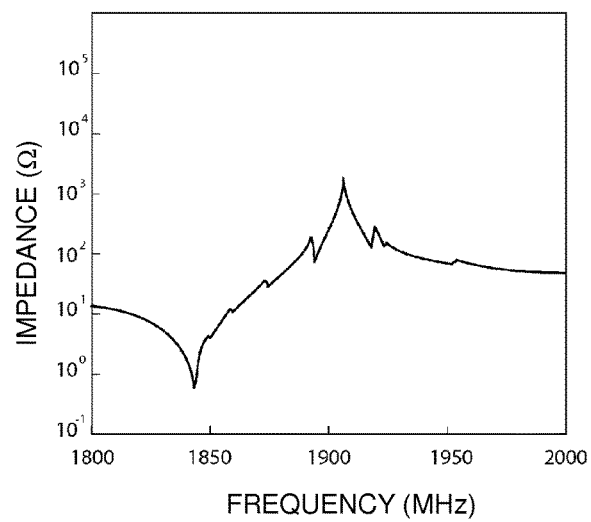
FIG. 4 is a graph illustrating an impedance-frequency characteristic of the comparative example shown in FIG. 3.

FIG. 2 is a graph illustrating an impedance-frequency characteristic of the elastic wave device of this preferred embodiment. FIG. 4 is a graph illustrating an impedance-frequency characteristic of an elastic wave device of a comparative example. The major portion of the IDT electrode of the elastic wave device of this comparative example will be described below with reference to FIG. 3. As shown in FIG. 3, in this comparative example, a first busbar 1011 includes a thick strip-shaped metallized portion only. That is, in this comparative example, unlike the above-described preferred embodiment, the central busbar section 11B having a plurality of openings 15 is not provided. Thus, the portion in which the first busbar 1011 is provided defines a region at a low acoustic velocity indicated by V14.

Moreover, in the comparative example, the projecting portion 13e shown in FIG. 1B is not provided. In the comparative example, instead of the elongated sections 13a through 13d, an elongated section 13x is provided. Similarly, in the electrode finger 14, an elongated section 14X is provided. The elongated sections 13x and 14x define a low acoustic velocity region at an acoustic velocity V12. The configurations of the other portions of the comparative example are similar to those of the above-described preferred embodiment. The acoustic velocities V11 through V14 of the regions V11 through V14 in the elastic wave device of the comparative example in the extending direction of the electrode fingers of the IDT electrode are schematically indicated on the right side of FIG. 3.

As is clearly seen from FIGS. 2 and 4, FIG. 4 shows that large ripples appear in a region between the resonant frequency and the anti-resonant frequency and in a region at a higher frequency side than the anti-resonant frequency. These ripples are transverse mode ripples.

In the above-described preferred embodiment, the levels of the acoustic velocities $V_1$ through $V_6$ of the regions V1 through V6 are as those shown in FIG. 1B. That is, by providing the inner busbar section 11A in addition to the elongated sections 13a, 13b, 14a, and 14b, the average of the acoustic velocities of the regions V2, V3, and V4, which are low acoustic velocity regions, is effectively reduced.

Thus, the difference ΔV in the acoustic velocity between the low acoustic velocity regions and the central region is very large. Because of this very large difference ΔV, the occurrence of transverse mode ripples are effectively reduced or prevented. That is, as the difference ΔV is greater, a piston mode is more likely to be generated, thus making it possible to more effectively reduce or prevent the occurrence of transverse mode ripples.

Figure 5:
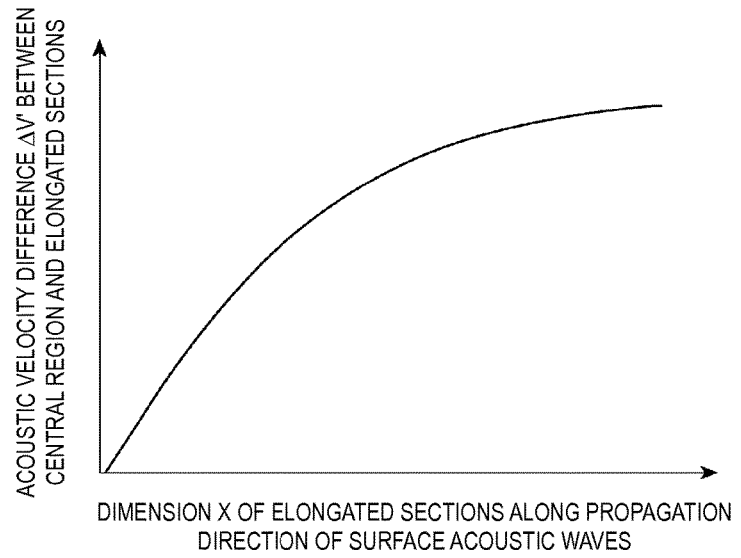
FIG. 5 is a graph illustrating the relationship between a dimension difference X between a central region and elongated sections and the acoustic velocity difference ΔV' between the central region and the elongated sections.

In the busbar 11, by the provision of the openings 15, the acoustic velocity $V_5$ of the region V5, which is a high acoustic velocity region, where the central busbar section 11B is generated is effectively increased. With this configuration, a leakage of elastic waves toward the busbar is significantly reduced or prevented, thus making it possible to reduce the loss of the device. FIG. 5 is a graph illustrating the relationship between the dimension X of the elongated sections 13a, 13b, 14a, and 14b along the propagation direction of surface acoustic waves and the acoustic velocity difference ΔV' between the acoustic velocity $V_1$ of the central region and the acoustic velocity $V_2$ of the elongated sections. As is clearly seen from FIG. 5, as the dimension of the elongated sections 13a, 13b, 14a, and 14b along the propagation direction of surface acoustic waves is increased, the acoustic velocity difference ΔV' is increased.

Figure 6:
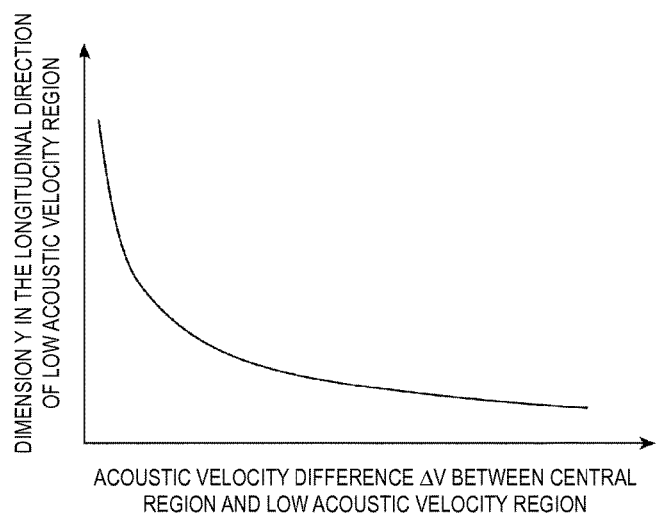
FIG. 6 is a graph illustrating the relationship between the acoustic velocity difference ΔV between a central region and a low acoustic velocity region and the dimension Y in the longitudinal direction of the low acoustic velocity region when a piston mode is provided.

FIG. 6 is a graph illustrating the relationship between the acoustic velocity difference ΔV between the central region and the low acoustic velocity region and the longitudinal dimension Y of the low acoustic velocity region in the extending direction of the electrode fingers when the conditions for forming a piston mode are satisfied. As is seen from FIG. 6, as the longitudinal dimension Y of the low acoustic velocity region in the extending direction of the electrode fingers is smaller, the acoustic velocity difference ΔV between the central region and the low acoustic velocity region required to generate a piston mode is increased. In order to generate an ideal piston mode to significantly reduce or prevent the occurrence of all transverse mode ripples, the dimension Y is desirably smaller. That is, it is desirable to increase the acoustic velocity difference ΔV between the central region and the low acoustic velocity region.

In a structure such as that of the comparative example shown in FIG. 3, since the low acoustic velocity region is defined only by an elongated section, it is not possible to considerably increase the acoustic velocity difference between the central region and the low acoustic velocity region. It is thus necessary to provide a larger dimension Y in order to generate a piston mode. In this case, however, an ideal piston mode is not provided. Because of this reason, transverse mode ripples occur, as show in FIG. 4.

In contrast, in the structure of this preferred embodiment shown in FIG. 1B, by the provision of the inner busbar 11A, the acoustic velocity difference ΔV between the central region and the low acoustic velocity region is increased, and thus, the dimension Y required to generate a piston mode is decreased. Accordingly, it is possible to generate an ideal piston mode so that the occurrence of transverse mode ripples is effectively reduced or prevented.

According to the experiments conducted by the inventors, it has been proved that the duty ratio of electrode fingers in the portion where the above-described elongated sections 13a, 13b, 14a, and 14b are provided is desirably about 0.7 to about 0.9, for example. As the duty ratio is greater, the acoustic velocity difference ΔV is able to be increased. However, due to the limitations in terms of the process, the duty ratio is desirably about 0.9 or smaller, for example.

In this preferred embodiment, the distance between the leading ends of the second electrode fingers 14 and the first busbar 11 along a direction perpendicular or substantially perpendicular to the propagation direction of surface acoustic waves, that is, the dimension of a gap between the leading ends of the electrode fingers of one bus bar and the other bus bar, which is indicated by the region V3, is desirably smaller. However, there are also limitations on decreasing the above-described dimension of the region V3 in terms of the process. According to the experiments conducted by the inventors of this application, it is desirable that the dimension of the gap is about 0.5λ or smaller, and more preferably, about 0.25λ or smaller, where λ is the wave length of surface acoustic waves, for example.

In this preferred embodiment, due to the provision of the projecting portions 13e and 14e, the width of the electrode fingers in the region V3 is greater than that of the electrode fingers 13 and 14 in the region V1. However, the provision of these projecting portions 13e and 14e may be omitted. That is, the width of the electrode fingers 14 in the region V3 may be equal to that in the region V1, which is the central region.

Preferably, however, as in this preferred embodiment, it is desirable to provide the projecting portions 13e and 14e in the region V3 so as to further reduce the acoustic velocity in the region V3. Then, it is possible to further decrease the average of the acoustic velocities $V_2$ through $V_4$, which is the overall acoustic velocity of the low acoustic velocity regions V2 through V4.

The region V4 where the inner busbar section 11A is located is also a low acoustic velocity region. As discussed above, since the entirety of the inner busbar section 11A is metallized, the acoustic velocity is effectively reduced. This inner busbar section 11A preferably has a narrow strip shape, and it is desirable to set the dimension of the inner busbar section 11A along a direction perpendicular or substantially perpendicular to the propagation direction of surface acoustic waves, that is, the width of the inner busbar section 11A, to be about 0.5λ or smaller.

In this preferred embodiment, the width of the interconnecting portions 16 of the central busbar section 11B is set to be equal to that of the electrode fingers 13 and 14 in the region V1. However, it is not always necessary that the widthwise dimension of the interconnecting portions 16 be equal to that of the electrode fingers 13 and 14.

The duty ratio of the electrode fingers in the region V1 preferably is about 0.5, for example. In this preferred embodiment, the width of the central busbar section 11B, which is a high acoustic velocity region, in a direction perpendicular to the propagation direction of surface acoustic waves preferably is about 2.0λ, for example. The width of a high acoustic velocity region is set to be as large as that with which the energy of surface acoustic waves excited in the IDT electrode is able to be sufficiently decreased in the outer busbar section 11C.

In this preferred embodiment, as stated above, the elongated sections 13a, 13b, 13c, 13d, 14a, 14b, 14c, and 14d preferably are provided, and the regions V2 through V4, which are low acoustic velocity regions, and the region V5, which is a high acoustic velocity region, where the openings 15 are located, are provided farther outward than the region V1, which is a central region. Then, the acoustic velocity difference ΔV between the acoustic velocity of the central region and the average of the acoustic velocities of the low acoustic velocity regions is very large. It is thus possible to effectively reduce or prevent the occurrence of transverse mode ripples. The reason for this is that, as the acoustic velocity difference ΔV is greater, an ideal piston mode is more likely to be generated. It is thus possible to effectively significantly reduce or prevent transverse mode spurious emissions, as shown in FIG. 2.

FIGS. 7 through 14 are respectively partial cutaway schematic plan views illustrating the major portions of elastic wave devices according to second through ninth preferred embodiments of the present invention.

Figure 7:
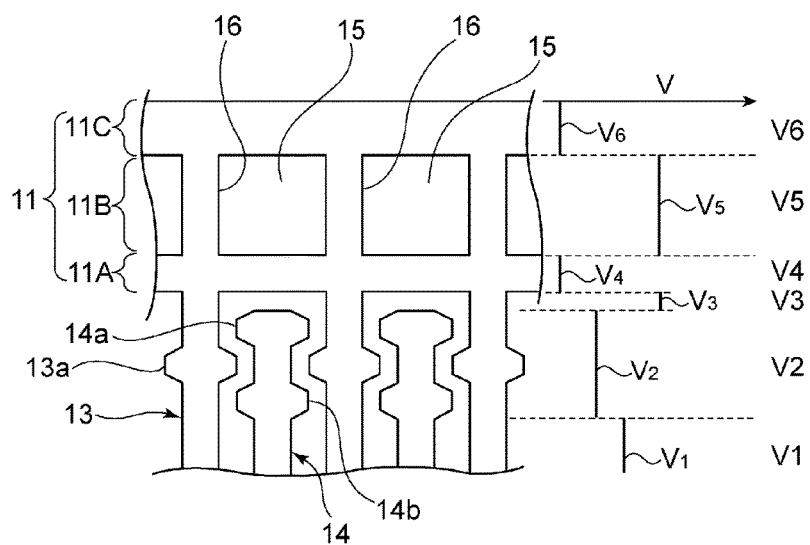
FIG. 7 is a partial cutaway plan view illustrating the major portion of an elastic wave device according to a second preferred embodiment of the present invention.

As in the second preferred embodiment shown in FIG. 7, the projecting portion 13e shown in FIG. 1B does not necessarily have to be provided at the base end of a first electrode finger 13. Similarly, in the second preferred embodiment, a projecting portion is not provided at the base end of a second electrode finger 14.

In the second preferred embodiment, corresponding to one elongated section 13a of a first electrode finger 13, two elongated sections 14a and 14b are provided in the second electrode finger 14 adjacent to this first electrode finger 13. Accordingly, 1.5 pairs of elongated sections are provided. The relationships among the acoustic velocities V1 through V6 of the regions V1 through V6 are indicated on the right side of FIG. 7, and it is seen that the acoustic velocity V3 is equal to the acoustic velocity V5. In the second preferred embodiment, as well as in the first preferred embodiment, the average of the acoustic velocities V2 through V4 of the regions V2 through V4, which are low acoustic velocity regions, is effectively reduced to a smaller level than the acoustic velocity V1 of the region V1, which is the central region. It is thus possible to effectively reduce or prevent the occurrence of transverse mode ripples, as in the first preferred embodiment. The configurations of the other portions of the second preferred embodiment are preferably similar to those of the first preferred embodiment.

Figure 8:
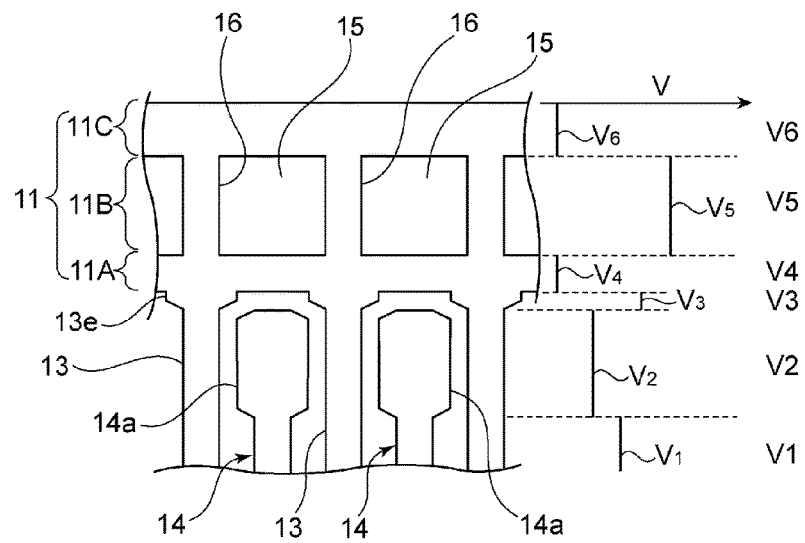
FIG. 8 is a partial cutaway plan view illustrating the major portion of an elastic wave device according to a third preferred embodiment of the present invention.

In the third preferred embodiment shown in FIG. 8, on the side of the first busbar 11, an elongated section 14a is provided at the leading end of a second electrode finger 14. In the vicinity of the area where this elongated section 14a is provided, there is no elongated section provided in the first electrode finger 13. The configurations of the other portions of the third preferred embodiment are similar to those of the first preferred embodiment. The relationships among the acoustic velocities $V_1$ through $V_6$ of the regions V1 through V6 in this preferred embodiment are schematically indicated on the right side of FIG. 8. In this preferred embodiment, as well as in the first preferred embodiment, the average of the acoustic velocities $V_2$ through $V_4$ of the regions V2 through V4 is effectively reduced to a smaller level than the acoustic velocity $V_1$ of the region V1, which is the central region. It is thus possible to effectively reduce or prevent the occurrence of transverse mode ripples, as in the first preferred embodiment.

As in the third preferred embodiment, an elongated section may be provided in only one of the first and second electrode fingers 13 and 14. Regarding the number of elongated sections, on the side of the first busbar 11, only the single elongated section 14a may be provided in one electrode finger.

In this preferred embodiment, one elongated section is provided at the leading end of the first electrode finger 13 in a manner similar to the elongated section 14a, and an elongated section is not provided in the second electrode finger 14 on the side of the second busbar 12.

Figure 9:
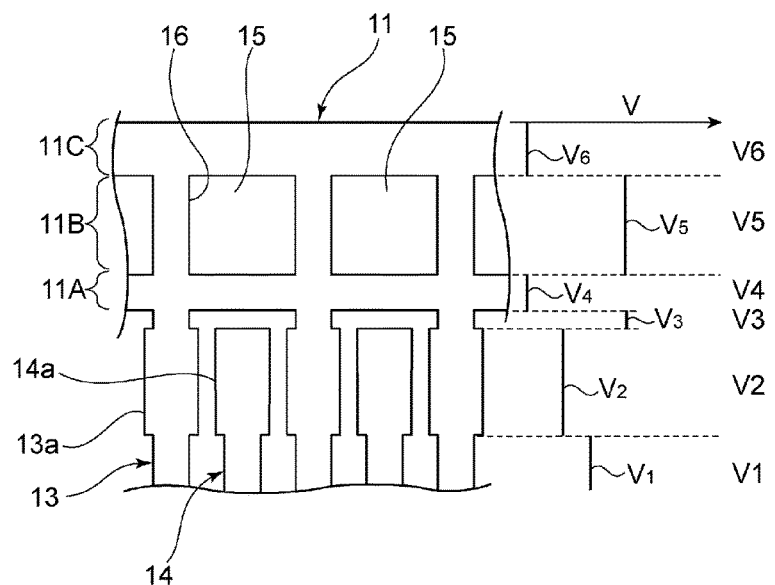
FIG. 9 is a partial cutaway plan view illustrating the major portion of an elastic wave device according to a fourth preferred embodiment of the present invention.

In the fourth preferred embodiment shown in FIG. 9, on the side of the first busbar 11, elongated sections 13a and 14a are provided in the first and second electrode fingers 13 and 14, respectively. That is, in an area closer to the first busbar 11, the elongated sections 13a and 14a are provided in the electrode fingers 13 and 14, respectively, so as to provide a low acoustic velocity region. The projecting portion 13e shown in FIG. 1B is not provided at the base end of the electrode finger 13. The projecting portion is not provided at the base end of the second electrode finger, either.

At the leading end of the first electrode finger 13, that is, on the side of the second busbar 12, one elongated section is provided at the leading end of the first electrode finger, and also, one elongated section is provided near the base end of the second electrode finger.

As in this preferred embodiment, it is possible that the acoustic velocity $V_2$ of the low acoustic velocity region V2 be effectively reduced by providing one elongated section in each of the electrode fingers 13 and 14. In this case, too, as in the first through third preferred embodiments, due to the principle of a piston mode, the occurrence of transverse mode ripples is effectively reduced or prevented.

Figure 10:
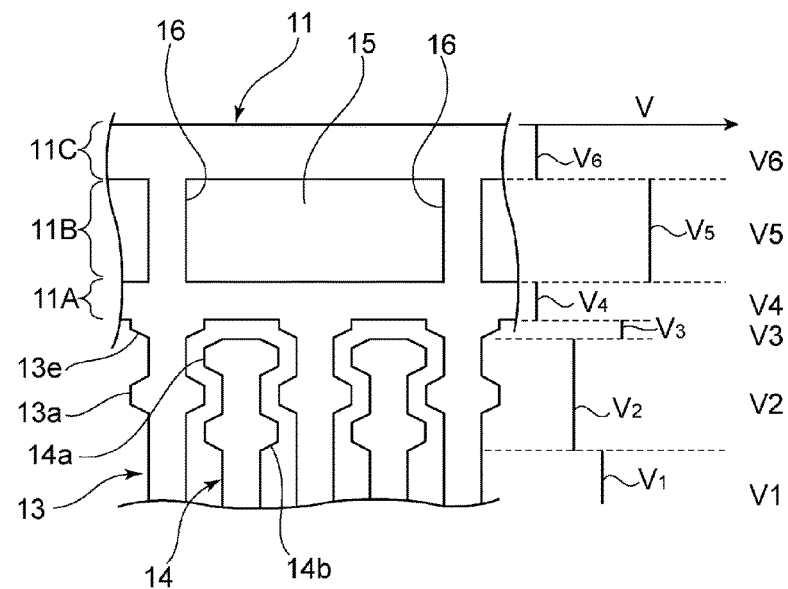
FIG. 10 is a partial cutaway plan view illustrating the major portion of an elastic wave device according to a fifth preferred embodiment of the present invention.

As in the fifth preferred embodiment shown in FIG. 10, the dimension of openings 15 along the propagation direction of elastic waves in the central busbar section 11B may be increased. In this case, the pitch between the interconnecting portions 16, 16 adjacent to an opening 15 is preferably set to be twice as large as the period of the first electrode finger 13 along the propagation direction of elastic waves. In this manner, the size of the openings 15 may be increased to be larger than that of the first preferred embodiment. The configurations of the other portions of the fifth preferred embodiment preferably are similar to those of the first preferred embodiment. In this preferred embodiment, as well as in the first preferred embodiment, while the occurrence of transverse mode ripples is being effectively reduced or prevented since the acoustic velocity $V_5$ of the region V5, which is a high acoustic velocity region, is effectively increased, elastic waves are reliably trapped. In particular, since the area of the openings 15 is larger, the acoustic velocity $V_5$ of the region V5 is increased more effectively.

Figure 11:
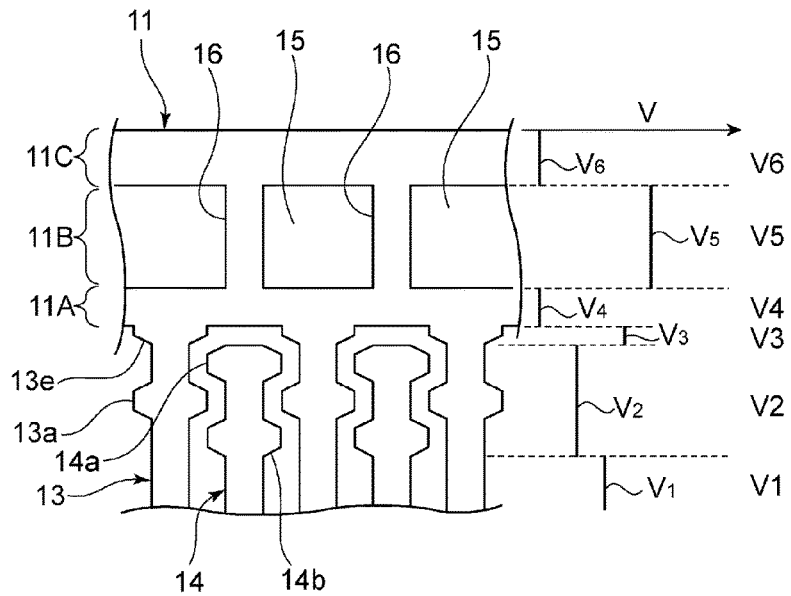
FIG. 11 is a partial cutaway plan view illustrating the major portion of an elastic wave device according to a sixth preferred embodiment of the present invention.

In the sixth preferred embodiment shown in FIG. 11, interconnecting portions 16, 16 are located on lines extending from the leading ends of the second electrode fingers 14. In this manner, the interconnecting portions 16, 16 may be located, not on lines extending from the first electrode fingers 13, but on lines extending from the second electrode fingers 14. In this case, for the purpose of enhancing the symmetrical characteristic, it is desirable that, on the side of the busbar 12, interconnecting portions be provided on lines extending from the leading ends of the first electrode fingers 13.

Figure 12:
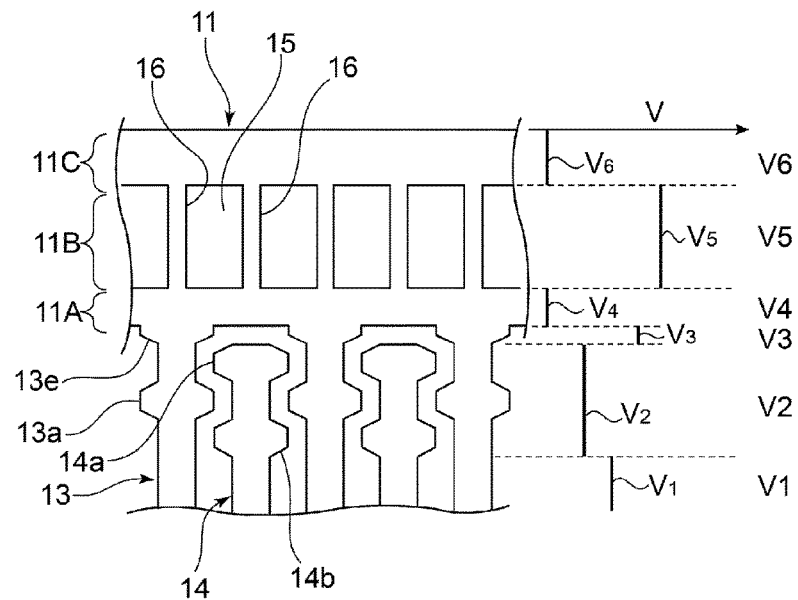
FIG. 12 is a partial cutaway plan view illustrating the major portion of an elastic wave device according to a seventh preferred embodiment of the present invention.
Figure 13:
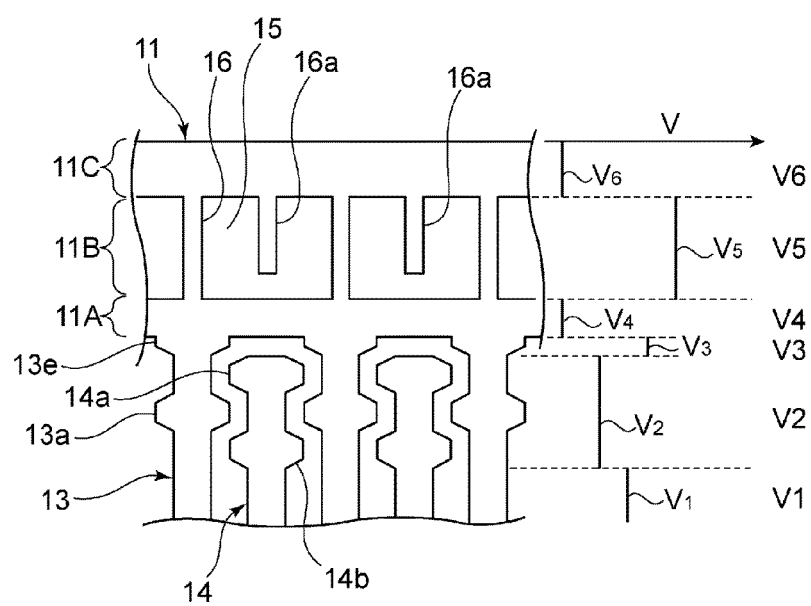
FIG. 13 is a partial cutaway plan view illustrating the major portion of an elastic wave device according to an eighth preferred embodiment of the present invention.

In the seventh preferred embodiment shown in FIG. 12, the width of interconnecting portions 16, that is, the dimension of the interconnecting portions 16 along the propagation direction of elastic waves, is set to be smaller than that of the electrode fingers 13 and 14. Then, the interconnecting portions 16 are located on lines extending from the first and second electrode fingers 13 and 14. Accordingly, the dimension of the openings 15 along the propagation direction of elastic waves is decreased. In this manner, it is possible to suitably adjust the mode of the arrangement of the interconnecting portions 16. In the eighth preferred embodiment shown in FIG. 13, instead of some of the interconnecting portions 16 shown in FIG. 12, electrode strips 16a which extend from the outer busbar section 11C toward the inner busbar section 11A but do not reach the inner busbar section 11A may be provided, that is, the interconnecting portions 16 and the electrode strips 16a may be alternately provided along the propagation direction of elastic waves. Alternatively, in contrast to the electrode strips 16a, electrode strips which extend from the inner busbar section 11A toward the outer busbar section 11C but do not reach the outer busbar section 11C may be provided.

Figure 14:
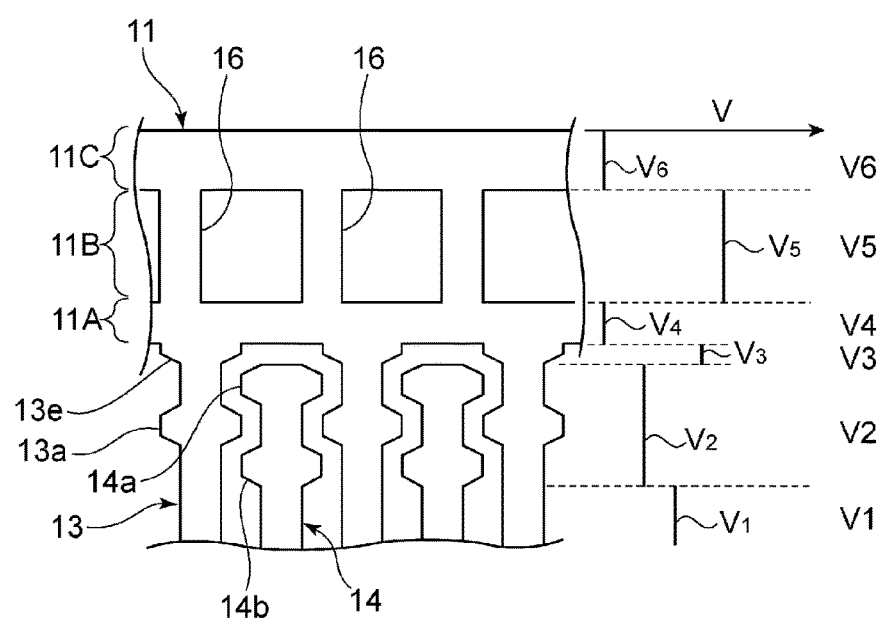
FIG. 14 is a partial cutaway plan view illustrating the major portion of an elastic wave device according to a ninth preferred embodiment of the present invention.

In the ninth preferred embodiment shown in FIG. 14, a plurality of interconnecting portions 16 may be located such that they are displaced from lines extending from the electrode fingers 13 and 14 in the propagation direction of elastic waves.

As shown in FIGS. 7 through 14, in various preferred embodiments of the present invention, as long as the acoustic velocity $V_5$ of the region V5, which is a high acoustic velocity region, is able to be enhanced, the configuration of the openings 15 and the dimensions, configuration, and pitch of the interconnecting portions 16 may be modified in various modes, and are not restricted to the structures shown in the drawings.

As long as the average of the acoustic velocities $V_2$ through $V_4$ of the regions V2 through V4, which are low acoustic velocity regions, is able to be reduced, the configurations and dimensions of the elongated sections 13a, 13b, 14a, and 14b may be modified in a suitable manner.

As discussed above, in an area where adjacent electrode fingers 13 and 14 are disposed, an elongated section may be provided only in one of these electrode fingers, or elongated sections may be provided in both of the electrode fingers 13 and 14, as in the first preferred embodiment. Moreover, elongated sections may be provided only at the base ends of the electrode fingers or at the leading ends thereof. That is, elongated sections may be provided at one side of the base ends and the leading ends of the electrode fingers.

The number of elongated sections in a low acoustic velocity region is not restricted to one or two, and a desired number of elongated sections may be provided.

The applications of various preferred embodiments of the present invention are not restricted to surface acoustic wave devices, and may be applied to various other elastic wave devices, such as boundary acoustic wave devices. Additionally, the applications of various preferred embodiments of the present invention are not restricted to an elastic wave device having the electrode configuration defining a one-port resonator, and may be applied to various other elastic wave devices, such as a band pass filter or a trap filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate; and
   an interdigital transducer electrode disposed on the piezoelectric substrate; wherein
   the interdigital transducer electrode includes a first busbar and a second busbar which is disposed separately from the first busbar, a plurality of first electrode fingers including a base end electrically connected to the first busbar and a leading end extending toward the second busbar, and a plurality of second electrode fingers including a base end connected to the second busbar and a leading end extending toward the first busbar;
   an elongated section is provided in at least the leading end of at least one of the first electrode fingers and the second electrode fingers, a dimension of the elongated section in a widthwise direction being larger than a dimension at a center of the first and second electrode fingers in a longitudinal direction, the widthwise direction being defined as a direction perpendicular to an extending direction of the first and second electrode fingers;
   at least one of the first and second busbars includes a plurality of openings provided separately from each other along a longitudinal direction of the first or second busbar;
   each of the first and second busbars includes an inner busbar section which is positioned closer to the first or second electrode fingers than the openings and which extends in the longitudinal direction of the first and second busbars, a central busbar section in which the openings are provided, and an outer busbar section which is positioned opposite to the inner busbar section with the central busbar section interposed therebetween; and
   an acoustic velocity of the inner busbar section is lower than an acoustic velocity of the central region.

2. The elastic wave device according to claim 1, wherein the inner busbar section has strip shape extending in a propagation direction of elastic waves.

3. The elastic wave device according to claim 1, wherein the elongated section is provided in each of the first and second electrode fingers.

4. The elastic wave device according to claim 1, wherein a plurality of the elongated sections are provided in at least one of the first and second electrode fingers.

5. The elastic wave device according to claim 1, wherein the interdigital transducer electrode is a normal interdigital transducer electrode to which apodization weighting is not applied.

6. The elastic wave device according to claim 1, wherein, when a wave length of elastic waves is indicated by $\lambda$, a distance between the leading ends of the first and second electrode fingers and the second and first busbars which respectively oppose the leading ends of the first and second electrode fingers is about $0.5\lambda$ or smaller.

7. The elastic wave device according to claim 1, wherein the first electrode finger includes a plurality of the elongated sections which are provided separately from each other in the extending direction of the electrode fingers, the second electrode finger includes a plurality of the elongated sections which are provided separately from each other in the extending direction of the electrode fingers, and the plurality of elongated sections of the first electrode finger and the plurality of elongated sections of the second electrode finger are alternately located in the extending direction of the electrode fingers in an area where the first electrode finger and the second electrode finger oppose each other.

8. The elastic wave device according to claim 7, wherein one elongated section provided in the first electrode finger is positioned between adjacent elongated sections provided in the second electrode finger in the extending direction of the second electrode finger, and one elongated section provided in the second electrode finger is positioned between adjacent elongated sections provided in the first electrode finger in the extending direction of the first electrode finger.

9. The elastic wave device according to claim 7, wherein the plurality of elongated sections of the first electrode finger and the plurality of elongated sections of the second electrode finger are fit into each other in an interdigitated pattern in an area where the first electrode finger and the second electrode finger are adjacent to each other in a propagation direction of elastic waves.

10. The elastic wave device according to claim 1, wherein the elastic wave device is a one-port surface acoustic wave resonator.

11. The elastic wave device according to claim 1, wherein each of the first and second electrode fingers includes projecting portions provided at the base end of the first and second electrode fingers and projecting in the widthwise direction thereof.

12. The elastic wave device according to claim 11, wherein an acoustic velocity of the projecting portions is higher than the acoustic velocity of the central region.

13. The elastic wave device according to claim 12, wherein the acoustic velocity of the openings is higher than the acoustic velocity of the projecting portions.

14. The elastic wave device according to claim 1, wherein the interdigital transducer electrode is provided on the piezoelectric substrate such that low acoustic velocity regions are located farther outward than the central region and high acoustic velocity regions are located farther outward than the low acoustic velocity regions.

15. The elastic wave device according to claim 1, wherein the interdigital transducer electrode is provided on the piezoelectric substrate such that the elastic wave device generates a piston mode.

16. The elastic wave device according to claim 1, wherein an entirety of the inner busbar section is metallized.

17. The elastic wave device according to claim 1, wherein when a wave length of elastic waves is indicated by λ, a width of the inner busbar section is about 0.5λ or smaller.

18. The elastic wave device according to claim 1, wherein the first and second electrode fingers include 1.5 pairs of elongated sections projecting in a width direction thereof.

19. The elastic wave device according to claim 1, wherein the plurality of openings are located between interconnecting portions extending in the extending direction of the electrode fingers.

20. The elastic wave device according to claim 19, wherein each of the interconnecting portions has a width that is equal or substantially equal to a width of each of the plurality of first and second electrode fingers.

21. The elastic wave device according to claim 19, wherein each of the interconnecting portions has a width that is less than a width of each of the plurality of first and second electrode fingers.

22. The elastic wave device according to claim 19, wherein each of the interconnecting portions is displaced from lines extending from the plurality of first and second electrode fingers in a propagation direction of elastic waves.

23. The elastic wave device according to claim 1, wherein the acoustic velocity of the inner busbar section is lower than the acoustic velocity of the elongated section.

24. The elastic wave device according to claim 1, wherein the elongated section is located in a region where the first electrode fingers and the second electrode fingers oppose each other in a propagation direction of elastic waves of the elastic wave device.

25. The elastic wave device according to claim 1, wherein an acoustic velocity of the elongated section is lower than the acoustic velocity of the central region.

26. The elastic wave device according to claim 25, wherein the acoustic velocity of the inner busbar section is lower than the acoustic velocity of the elongated section.

27. The elastic wave device according to claim 26, wherein each of the first and second electrode fingers includes projecting portions provided at the base end of the first and second electrode fingers and projecting in the widthwise direction thereof;
an acoustic velocity of the projecting portions is higher than the acoustic velocity of the central region; and
the acoustic velocity of the openings is higher than the acoustic velocity of the projecting portions.

28. The elastic wave device according to claim 27, wherein acoustic velocities of a region between the leading end of the first electrode fingers and the second busbar and acoustic velocities of a region between the leading end of the second electrode fingers and the first busbar are higher than the acoustic velocity of the elongated section.

29. The elastic wave device according to claim 25, wherein acoustic velocities of a region between the leading end of the first electrode fingers and the second busbar and acoustic velocities of a region between the leading end of the second electrode fingers and the first busbar are higher than the acoustic velocity of the elongated section.

30. The elastic wave device according to claim 1, wherein an acoustic velocity of the openings is higher than the acoustic velocity of the central region.

31. The elastic wave device according to claim 1, wherein acoustic velocities of a region between the leading end of the first electrode fingers and the second busbar and acoustic velocities of a region between the leading end of the second electrode fingers and the first busbar are higher than the acoustic velocity of the central region.

32. The elastic wave device according to claim 1, wherein an average of acoustic velocities of the elongated section, a region between the leading end of the first electrode fingers and the second busbar, a region between the leading end of the second electrode fingers and the first busbar, and the inner busbar section is lower than the acoustic velocity of the central region.

* * * * *